United States Patent
Schlösser et al.

(10) Patent No.: US 6,939,763 B2
(45) Date of Patent: Sep. 6, 2005

(54) DRAM CELL ARRANGEMENT WITH VERTICAL MOS TRANSISTORS, AND METHOD FOR ITS FABRICATION

(75) Inventors: Till Schlösser, Dresden (DE); Brian S. Lee, Apple Valley, MN (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/720,730

(22) Filed: Nov. 24, 2003

(65) Prior Publication Data

US 2004/0259312 A1 Dec. 23, 2004

Related U.S. Application Data

(63) Continuation of application No. PCT/EP02/05651, filed on May 23, 2002.

(30) Foreign Application Priority Data

May 29, 2001 (DE) .......................... 101 25 967

(51) Int. Cl.[7] .......................... H01L 21/8242
(52) U.S. Cl. .................. 438/253; 438/396; 257/329
(58) Field of Search .................... 438/238, 239, 438/253–256, 268, 381, 396–399; 257/302, 329

(56) References Cited

U.S. PATENT DOCUMENTS 5,888,864 A * 3/1999 Koh et al. .................. 438/253
6,326,269 B1 * 12/2001 Jeng et al. .................. 438/278
6,800,898 B2 * 10/2004 Cappelani et al. .......... 257/329

FOREIGN PATENT DOCUMENTS

| JP | 5-29573 | 2/1993 | ........... H01L/27/10 |
| WO | 00/55905 | 9/2000 | ....... H10L/21/8242 |

OTHER PUBLICATIONS

International Search Report, dated Aug. 13, 2003 for PCT/EP02/05651.

International Preliminary Examination Report, dated Oct. 21, 2003 for PCT/EP02/05651.

* cited by examiner

*Primary Examiner*—David Nelms
*Assistant Examiner*—Calvin Lee
(74) *Attorney, Agent, or Firm*—Moser, Patterson & Sheridan, L.L.P.

(57) ABSTRACT

DRAM cell arrangement with vertical MOS transistors, and method for its fabrication. Channel regions arranged along one of the columns of a memory cell matrix are parts of a rib which is surrounded by a gate dielectric layer. Gate electrodes of the MOS transistors belonging to one row are parts of a strip-like word line, so that at each crossing point of the memory cell matrix there is a vertical dual-gate MOS transistor with gate electrodes of the associated word line formed in the trenches on both sides of the associated rib.

13 Claims, 3 Drawing Sheets

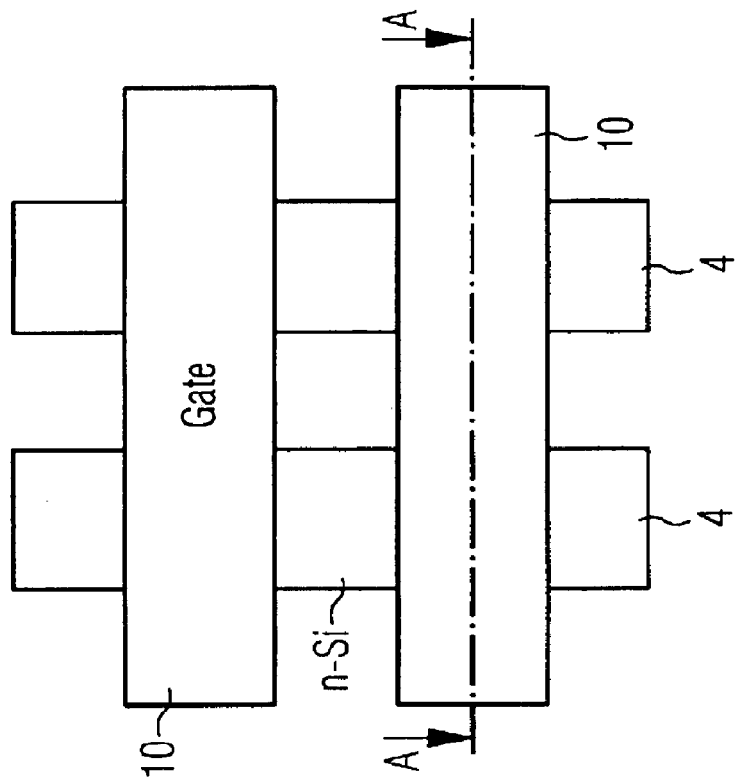
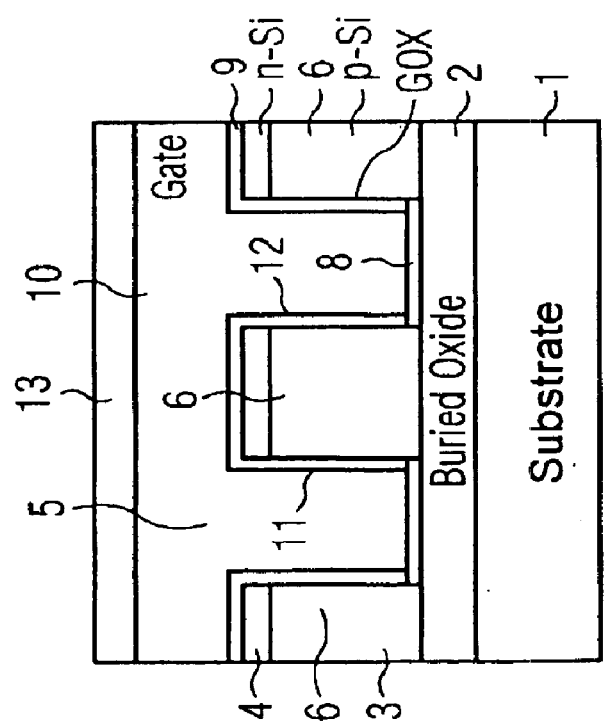

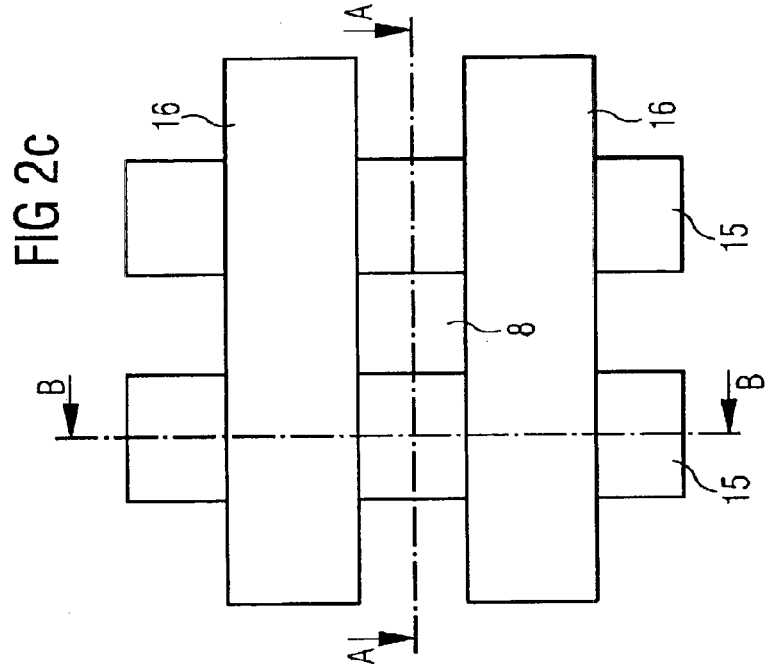
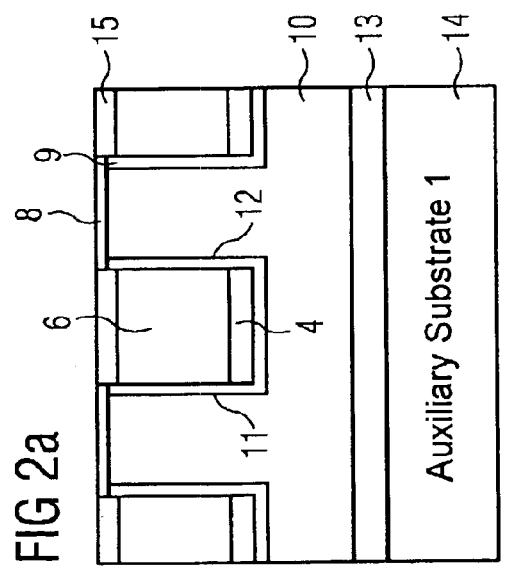
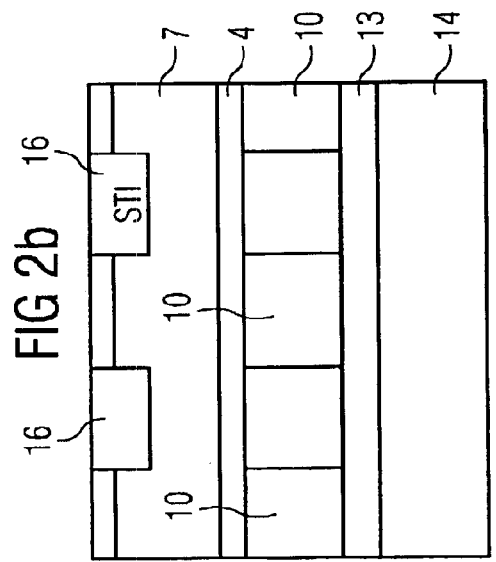

DRAM CELL ARRANGEMENT WITH VERTICAL MOS TRANSISTORS, AND METHOD FOR ITS FABRICATION

CROSS-REFERENCE TO RELATED APPLICATIONS

This application is a continuation of co-pending PCT patent application No. PCT/EP02/05651, filed May 23, 2002, which claims the benefit of German patent application serial number 101 25 967.0 DE, filed May 29, 2001. Each of the aforementioned related patent applications is herein incorporated by reference in their entireties.

BACKGROUND OF THE INVENTION

1. Field of the Invention

The invention relates to a DRAM cell arrangement with vertical MOS transistors, and to a method for its fabrication, in which the transistors do not have any floating bodies, but rather are to be fully depleted.

2. Description of the Related Art

Currently, the memory cell used in a DRAM cell arrangement, i.e. a dynamic semiconductor memory, is almost exclusively the single-transistor memory cell, which has long been known and comprises an MOS select transistor and a capacitor. The information in the memory cell is stored in the form of a charge on the capacitor. The capacitor is connected to the transistor in such a way that, when the transistor is driven via a word line, the charge of the capacitor can be read out via a bit line.

In general, it is attempted to produce a DRAM cell arrangement which has a high packing density. In this respect, it is advantageous to design the MOS transistor as a vertical transistor, in which source, channel region and drain are arranged above one another. An MOS transistor of this type can take up a small amount of space irrespective of a channel length. Furthermore, it is attempted to arrange the vertical transistor and the associated capacitor of each memory cell vertically above one another on a semiconductor substrate.

An arrangement comprising a large number of memory cells of this type is known, for example, from DE 44 30 483 A1. Each memory cell has a column-like, vertically arranged select transistor, which includes a drain region and a source region in a semiconductor substrate column, with a current channel, which likewise runs in the vertical direction, running between the drain region and the source region, which current channel is controlled by a control gate electrode which completely surrounds the substrate column, separated by a layer of oxide. The control gate electrodes (which consist, for example, of doped polysilicon) of various memory cells are electrically connected to one another and form the word line for driving the select transistor.

A particular problem of the known MOS transistor is the column-like channel region, which is insulated from the substrate and in which charge carriers collect, which may, for example, alter the threshold voltage. The complete insulation of the active region, which is also present, for example, in SOI (Silicon-on-Insulator) substrates, where it has a number of advantages, accordingly also leads to negative effects, known as floating body effects. These effects are caused by the fact that charge carriers produced in the active region cannot flow out. This applies in particular to charge carriers produced in a channel region of a MOS transistor.

On the other hand, in the known MOS transistors, despite the gate electrodes surrounding the channel region it is not ensured that the depletion zone extends from the periphery of the column-like channel region all the way to its center, i.e. it is not certain whether the MOS transistor is actually fully depleted in the sense of a depletion zone which completely fills the channel region.

A MOS transistor of the fully depleted type, which is increasingly desired on account of its benefits, appears to be achievable only in situations in which the p-doped channel region is limited in some way, unlike in the case of the planar standard MOS transistor (in which it is not separated from the substrate). This is the case, for example, for the column-like channel region of the known transistor or also in the case of a planar MOS transistor on an SOI substrate. In these cases, however, the fact that the connection of the channel region to the substrate is absent on account of the insulation, on the other hand, has been found, as described above, to in fact lead to a situation with a floating body.

DE 199 29 211 A1 has disclosed a DRAM cell arrangement and a fabrication method in which the MOS transistors are designed as vertical transistors and in which floating body effects are avoided. The transistor described in that document forms a hump-like projection in the substrate with a laterally adjoining gate electrode, while on the other side of the projection the channel region is electrically connected to the gate electrode via a conductive structure, so that charge carriers produced in the channel region can flow away. The overall result in this known cell arrangement, however, is a complicated, interwoven structure which is correspondingly complex to fabricate.

The invention is based on the object of providing a DRAM cell arrangement and a method for its fabrication which provides transistors of the fully depleted type as far as possible without floating bodies, and, at the same time, ensures a simple fabrication process.

SUMMARY OF THE INVENTION

According to the invention, this object is achieved by a DRAM cell arrangement having the features listed in patent claim 1.

The invention provides a DRAM cell arrangement having vertical MOS transistors:

having a matrix arrangement of memory cells which each have an MOS transistor with an upper source/drain region, a channel region and a lower source/drain region, which are stacked on top of one another as layers, and a capacitor which is connected to the MOS transistor, in which the channel regions of the MOS transistors of the memory cell matrix are arranged in rows and columns and the channel regions arranged along one of the columns are parts of a rib which runs horizontally in a substrate, in which the ribs are each surrounded by a gate dielectric layer on both sides and above the upper source/drain region, in which the gate electrodes of the MOS transistors, which are arranged along one of the rows of the memory cell matrix, are parts of a strip-like word line which runs parallel to the row, above the ribs, and engages from above in the trenches formed between the ribs in the column direction, filling these trenches to beyond the width of the word line, so that at each crossing point of the memory cell matrix there is a vertical dual-gate MOS transistor with gate electrodes of the associated word line formed in the trenches on both sides of the associated rib.

The basic idea of the invention consists in the fact that, first of all, the lateral dual gates of the vertical transistors, depending on the width and doping of the channel regions, can readily allow the transistors to be produced in fully depleted form and, secondly, contact can be made with the channel regions at the edge of the substrate via the ribs which connect them, so that the charge carriers can flow away.

A preferred embodiment provides a DRAM cell arrangement, in which each memory cell has a capacitor which is stacked beneath the MOS transistor and is electrically connected to the lower source/drain region, and in which a metal bit line runs above the MOS transistors, which are arranged along one of the columns, parallel to the column, which metal bit line lies above the word lines and is electrically connected to the upper source/drain regions of the associated MOS transistors.

The upper source/drain regions of a column may advantageously be formed as a strip-like, continuous region and may be jointly connected to the corresponding metal bit line.

The invention furthermore provides a method for fabricating a DRAM cell arrangement which, in one embodiment, comprises the following steps:

a) implanting doping ions in order to produce an array of upper source/drain regions on a substrate;

b) etching the trenches by means of lithographically produced mask patterns in order to produce the channel regions which are connected to form ribs;

c) producing a covering layer in the trenches and producing a gate dielectric layer on the surfaces of the ribs;

d) depositing and patterning the strip-like word lines, gate electrodes being produced on both sides of each MOS transistor;

e) depositing a first auxiliary layer, which is capable of wafer bonding, on the front surface of the substrate, then applying a first auxiliary carrier substrate to this first auxiliary layer and then removing the substrate;

f) implanting doping ions in order to produce an array of lower source/drain regions on the channel regions;

g) producing shallow isolation trenches by STI technology.

This in particular opens up the possibility of what is overall a simple DRAM fabrication method by means of the following additional steps:

h) producing contact structures and capacitors which are stacked on the front surface of the first auxiliary carrier substrate with contact to the lower source/drain regions of the associated MOS transistors;

i) depositing a second auxiliary layer, which is capable of wafer bonding, on the front surface of the first auxiliary carrier substrate, then applying a second auxiliary carrier substrate to this second auxiliary layer and then removing the first auxiliary carrier substrate and the first auxiliary layer;

j) forming a structured metal bit line on the front surface of the second auxiliary carrier substrate for making direct electrical contact with the upper source/drain regions.

BRIEF DESCRIPTION OF THE DRAWINGS

Preferred embodiments of the DRAM cell arrangement according to the invention and of the fabrication method thereof are described below with reference to the appended figures, in which:

FIGS. 1a, 2a, 3 and 4 show sectional illustrations on section line A—A in FIG. 1b for illustrating successive process steps involved in the fabrication of the DRAM cell arrangement according to the invention;

FIGS. 1b and 2c show plan views of DRAM cell arrangements which have been fabricated in accordance with the invention for the process steps shown in FIGS. 1a and 2a, respectively;

FIG. 2b shows a sectional illustration on section line B—B in FIG. 2c.

DETAILED DESCRIPTION OF THE PREFERRED EMBODIMENT

Figure 4:
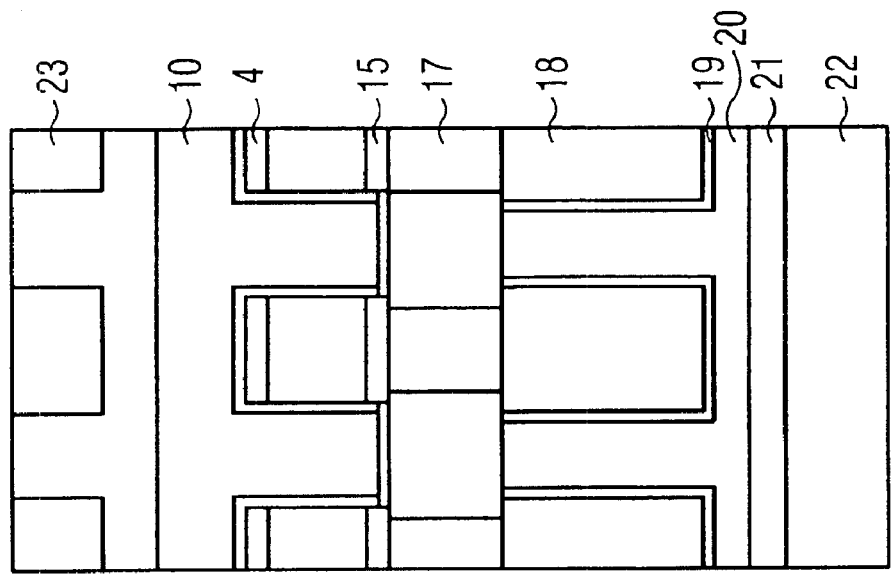
Figure 3:
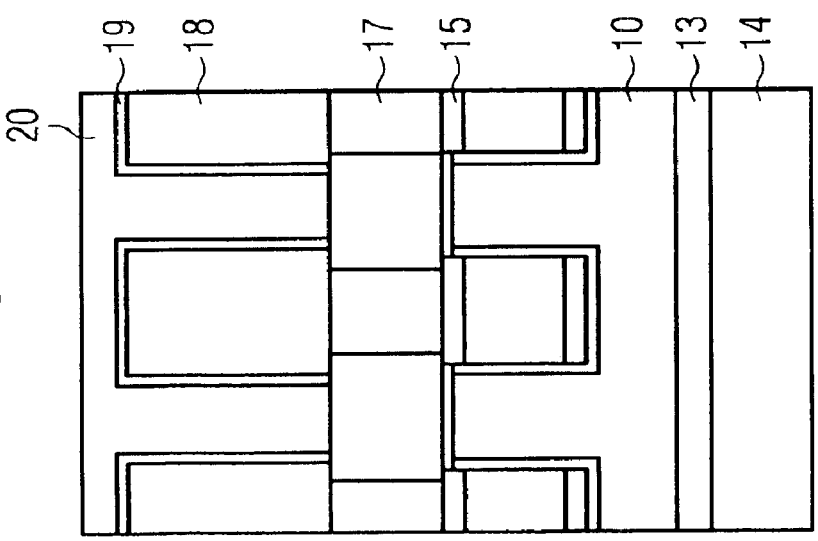

The individual process steps involved in the fabrication of the DRAM cell arrangement according to the invention are described below with reference to FIGS. 1 to 4.

FIG. 1b shows, by way of example, an arrangement (matrix) of four memory cells, in which the strip-like word lines 10 (gate) in the plan view shown in FIG. 1b define the rows of the matrix and make contact with the transistors which are arranged next to one another in a row, while the strip-like upper source/drain regions 4, which define columns, in each case run above the transistors which are arranged in one of the columns. FIG. 1a shows a section through this cell arrangement on line A—A as shown in FIG. 1b. As will be explained in more detail below, it is advantageous with regard to manufacturing technology to start from an SOI substrate, i.e. from a substrate 1 having a p-silicon layer 3 which is to be patterned above it and a buried oxide layer 2 in-between.

As can be seen from FIG. 1a, first of all implantation steps are used to produce an array of upper n-doped source/drain regions 4 on the SOI wafer, i.e. on the p-silicon layer 3. At this point in the process sequence, further implantation steps (array of wells, periphery, etc) and the production of trench isolations using STI (Shallow Trench Isolation) technique for the periphery may advantageously be carried out.

There then follows the (dry) etching of the trenches 5 running in the column direction by means of lithographically produced mask patterns, so that continuous ribs 7, which are delimited by the trenches 5, of p-silicon remain (cf. FIG. 2b). The channel regions 6 of the transistors which are arranged next to one another result in the row direction (cf. FIG. 1a).

In the next step, by way of example, silicon nitride is deposited, is planarized by means of a CMP process and is then etched back, so that nitride layers, which subsequently serve as covering layer 8, are produced in the trenches 5. Then, gate oxide 9 is produced on both sides of and above the ribs 7; if appropriate, the procedure can be carried out separately for the transistors in the cell array and in the periphery. The gate oxide 9 may in particular be produced with the aid of a thermally grown oxide layer.

The next process step involves the deposition, lithographic patterning and etching of the strip-like word lines 10. The conductive material, for example doped polysilicon, tungsten, silicon nitride or a layer system with an intermediate tungsten nitride layer, also fills the trenches 5, so that the gate electrodes 11 and 12 are formed. After etching of the word line 10, further SiN deposition and etching steps can be carried out, in particular for the fabrication of spacers. Moreover, further source/drain regions may be implanted in the periphery, for example in order to fabricate logic circuits on the chip. Finally, a first auxiliary layer 13, which is capable of wafer bonding, typically an oxide layer (although a BPSG layer is also possible) can be deposited and, if necessary, planarized, so that the production state shown in FIG. 1a results.

In a subsequent wafer bonding step, a first auxiliary carrier substrate 14 is applied or adhesively bonded to the planarized auxiliary (oxide) layer 13. This can be achieved by heating the opposite surfaces and then joining them. After the boundary surfaces have been joined and cooled, an unreleasable chemical bond is formed after a predetermined time between the auxiliary (oxide) layer (13) and the first auxiliary carrier substrate 14.

The processing of the structure which is formed (initially) takes place from the opposite side for the further process steps. For this purpose, the entire structure is "turned over", and the substrate 1 which is now at the top is etched away by wet etching, with the buried oxide layer 2 advantageously serving as an etch stop. Furthermore, the buried oxide layer 2 is removed by chemical mechanical planarization CMP or by a further etching step, with the covering layer 8, in particular a silicon nitride layer, which has previously been produced being used to stop these processes before the gate oxide 9.

Doping ions are implanted into the surface which has now been uncovered, cf. FIG. 2a, i.e. what was previously the back surface, in order to produce an array of lower source/drain regions 15 on the channel regions 6. Then, cf. FIGS. 2b and c, shallow isolation trenches 16 are produced in strip form using STI technology in the usual way (lithography, etching, oxide deposition, CMP), since the lower source/drain regions, unlike the upper source/drain regions, have to be electrically isolated.

This results in the production state shown in FIG. 2. The basic idea of the invention can be demonstrated most easily if FIGS. 2a and 2b, which each show a section, in mutually perpendicular section directions, on one of the two lines indicated in the plan view shown in FIG. 2c, are viewed in combination.

FIG. 2a clearly shows the vertical MOS transistors, which each comprise an upper and a lower source/drain region 4 and 15 and a channel region 6 which runs vertically between them, as well as the gate oxide 9. Gate electrodes 11 and 12, which are connected to one another by the strip-like word line 10, are formed in each of the trenches 5 to the sides, i.e. to the left and right, of the channel regions 6.

Therefore, according to the invention these are vertical transistors with lateral dual gates, so that, firstly, depending on the width and doping of the channel regions 6, it is readily possible to produce fully depleted transistors. The transistors are attached to one another in the row direction in such a way that each transistor in the lateral direction has two gate electrodes 11 and 12, but each gate electrode in a trench 5 can also be considered to belong to two adjacent transistors.

Secondly, the vertical transistors are attached to one another in the column direction in such a way, cf. FIG. 2b, that the channel regions 6 are formed as a continuous rib 7. The transistors, or more specifically the channel regions 6 of the transistors of one column, accordingly do not form individual silicon columns which are isolated from one another, but rather a wall-like structure, namely the rib 7. These structures can either adopt a substrate-like character themselves, on account of their size, or at least open up the possibility of making contact at the substrate edge. Floating body effects can be considerably reduced or even avoided altogether by means of the channel regions 6 which are grounded by the fact that contact is made at the substrate edge.

It is recommended to fabricate cell arrangements with memory cells which in each comprise a vertical transistor, a capacitor arranged below the vertical transistor and a metal bit line arranged above the transistor. This substantially requires the following additional steps:

First of all, contact structures 17 are produced on the front surface of the first auxiliary carrier substrate 14, and stack capacitors are produced above the contact structures. The contact structures 17 in each case connect the lower source/drain region 15 of each transistor to the first electrode 18 of the capacitor which is stacked beneath the transistor. A dielectric 19, for example tantalum pentoxide, in each case separates the first electrode 18 from the opposite electrode of the capacitor, which is in each case designed and connected as a common capacitor plate 20. In the case of the stacked capacitor, all conventional embodiments (box, cylinder, etc.) are suitable, and the same applies to the materials, metal electrodes and dielectrics with a very high dielectric constant being preferred. Overall, therefore, capacitors with a simple, low-resistance connection and without restrictions to the aspect ratio caused by the metallization, as would occur with trench capacitors, are possible.

After the stacked capacitors have been fabricated, a second auxiliary (oxide) layer 21 is in turn deposited above the capacitors, and a second auxiliary carrier substrate 22 is applied or adhesively bonded in a wafer bonding step. Then, the entire structure is turned over again, so that it is now possible to produce metal bit lines 23 and contacts (not shown) on the front surface of the auxiliary carrier substrate 22 using conventional method steps.

The DRAM cell arrangement according to the invention, which is illustrated in FIG. 4 and, after the "turning over" operation has been carried out twice, now has the desired arrangement (substrate, the buried capacitor above it, then the vertical transistor and the metal bit line at the top) offers a very large scale of integration, on account of the vertically arranged select transistors and the capacitors stacked below them. A memory cell has a size of approximately 4F2, with the smallest lithographic feature size being F<0.2 $\mu$m.

The fabrication process for fabrication of the DRAM cell arrangement according to the invention is very simple in particular with regard to the lithography (use of strip masks) and in particular includes a very simple metallization operation.

In particular, the multiple use of wafer bonding in the process sequence makes it possible to combine the fundamental advantages of the trench technology (simple metallization, ease of integration of vertical transistors, since capacitance and metallization lie in different directions, as seen from the device), and of the stack technology (process sequence according to falling thermal budget: device, capacitor, metallization).

What is claimed is:

1. A method for fabricating a DRAM cell arrangement with vertical MOS transistors, comprising:

forming a source/drain material on a substrate;

etching trenches to form a plurality of parallel ribs having strips of the source/drain material disposed thereon, wherein the strips provide sites for a plurality of upper source/drain regions of the vertical MOS transistors;

depositing a covering layer on a floor of the trenches;

depositing a gate dielectric layer on the surfaces of the ribs;

filling the trenches whereby gate electrodes for the vertical MOS transistors are produced on either side of the ribs;

forming a plurality of word lines over, and cross-wise with respect to, the ribs;

depositing a first auxillary layer, capable of wafer bonding, on the plurality of word lines;

attaching a first auxiliary carrier substrate to the first auxiliary layer;

removing at least the substrate;

forming a plurality of lower source/drain regions on the ribs, wherein portions of the ribs disposed between the plurality of lower source/drain regions and the plurality of upper source/drain regions define channel regions for the vertical MOS transistors; and forming shallow isolation trenches to isolate the plurality of lower source/drain regions.

2. The method of claim 1, further comprising forming capacitors stacked, with respect to the vertical MOS transistors, on the first auxiliary carrier substrate and in electrical contact with the plurality of lower source/drain regions of respective vertical MOS transistors.

3. The method of claim 1, further comprising:

depositing a second auxiliary layer, capable of wafer bonding, on the first auxiliary carrier substrate;

attaching a second auxiliary carrier substrate to the second auxiliary layer;

removing the first auxiliary carrier substrate and the first auxiliary layer;

forming metal bit lines on the second auxiliary carrier substrate for making direct electrical contact with the plurality of upper sourceldrain regions.

4. The method of claim 1, wherein the substrate and ribs are components of an SOI substrate comprising a buried oxide layer and further comprising removing the buried oxide layer prior to forming the plurality of lower source/drain regions on the ribs.

5. The method of claim 1, wherein forming the plurality of upper and lower source/drain regions comprises implanting doping ions.

6. The method of claim 1, wherein etching the trenches is done using lithographically produced mask patterns.

7. A DRAM cell arrangement with vertical MOS transistors, comprising:

a plurality of upper source/drain regions of the vertical MOS transistors formed by etching trenches in a source/drain material formed on a substrate to form a plurality of parallel ribs having strips of the source/drain material disposed thereon;

a covering layer deposited on a floor of the trenches;

a gate dielectric layer deposited on the surfaces of the ribs;

a plurality of gate electrodes for the vertical MOS transistors formed on either side of the ribs by filling the trenches;

a plurality of word lines formed over, and cross-wise with respect to, the ribs;

a first auxiliary layer, capable of wafer bonding, deposited on the plurality of word lines;

a first auxiliary carrier substrate attached to the first auxiliary layer;

a plurality of lower source/drain regions farmed on the ribs after removal of the substrate, wherein portions of the ribs disposed between the plurality of lower source/drain regions and the plurality of upper source/drain regions define channel regions for the vertical MOS transistors; and a plurality of shallow isolation trenches formed to isolate the plurality of lower source/drain regions.

8. The DRAM cell arrangement of claim 7, further comprising:

a plurality of capacitors stacked, with respect to the vertical MOS transistors, on the first auxiliary carrier substrate and in electrical contact with the plurality of lower source/drain regions of respective vertical MOS transistors.

9. The DRAM cell arrangement of claim 7, further comprising:

a second auxiliary layer, capable of wafer bonding, deposited on the first auxiliary carrier substrate;

a second auxiliary carrier substrate attached to the second auxiliary layer; and a plurality of metal bit lines formed, after removal of the first auxiliary carrier substrate and the first auxiliary layer, on the second auxiliary carrier substrate for making direct electrical contact with the plurality of upper source/drain regions.

10. The DRAM cell arrangement of claim 7, wherein the substrate and ribs are components of an SOI substrate comprising a buried oxide layer.

11. The DRAM cell arrangement of claim 10, wherein the buried oxide layer is removed prior to forming the plurality of lower Source/drain regions on the ribs.

12. The DRAM cell arrangement of claim 7, wherein the plurality of upper and lower source/drain regions are formed by implanting doping ions.

13. The DRAM cell arrangement of claim 7, wherein the trenches are etched utilizing lithographically produced mask patterns.

* * * * *

UNITED STATES PATENT AND TRADEMARK OFFICE
CERTIFICATE OF CORRECTION

PATENT NO. : 6,939,763 B2 Page 1 of 1
APPLICATION NO. : 10/720730
DATED : September 6, 2005
INVENTOR(S) : Till Schlösser et al.

It is certified that error appears in the above-identified patent and that said Letters Patent is hereby corrected as shown below:

In Claim 1, at Column 7, Line 1, replace "auxillary" with --auxiliary--.

In Claim 3, at Column 7, Line 28, replace "sourceldrain" with --source/drain--.

In Claim 11, at Column 8, Line 40, replace "Source/drain" with --source/drain--.

Signed and Sealed this

Twelfth Day of June, 2007

JON W. DUDAS
*Director of the United States Patent and Trademark Office*